(12) United States Patent
Jiang et al.

(10) Patent No.: US 7,485,966 B2
(45) Date of Patent: Feb. 3, 2009

(54) VIA CONNECTION STRUCTURE WITH A COMPENSATIVE AREA ON THE REFERENCE PLANE

(75) Inventors: Shin-Shing Jiang, Hsin-Tien (TW); Sheng-Yuan Lee, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 706 days.

(21) Appl. No.: 11/103,048

(22) Filed: Apr. 11, 2005

(65) Prior Publication Data

US 2006/0226533 A1  Oct. 12, 2006

(51) Int. Cl.
*H01L 29/40* (2006.01)
(52) U.S. Cl. ........................... 257/774; 257/698
(58) Field of Classification Search ................... 257/774, 257/698
See application file for complete search history.

(56) References Cited

U.S. PATENT DOCUMENTS

| | | | | |
|---|---|---|---|---|
| 4,943,539 A | * | 7/1990 | Wilson et al. ................ | 438/629 |
| 6,501,181 B2 | * | 12/2002 | Albinsson ..................... | 257/774 |
| 6,657,130 B2 | * | 12/2003 | Van Dyke et al. ............ | 174/255 |
| 7,030,712 B2 | * | 4/2006 | Brunette et al. ................ | 333/33 |
| 7,154,356 B2 | * | 12/2006 | Brunette et al. ................ | 333/33 |
| 7,291,916 B2 | * | 11/2007 | Hsu et al. ..................... | 257/738 |
| 7,348,494 B1 | * | 3/2008 | Handforth et al. ............ | 174/260 |

* cited by examiner

*Primary Examiner*—Douglas M Menz
(74) *Attorney, Agent, or Firm*—J.C. Patents

(57) ABSTRACT

The invention discloses a via connection structure with compensative area on a reference plane. The substrate has several conductive layers isolated by the insulation layers. When two conductive lines formed on different conductive layers where a reference plane is sandwiched in, these two conductive lines are not electrical connected because of the insulation layers. Furthermore, a via connection structure is common used to connect these two conductive lines. When a non-conductive area, i.e. the compensative area, on the reference plane is overlapped with a portion of one conductive line and is close to the via connection structure, it compensates the capacitive effect of the via connection structure. By this compensative area and the variety of the via connection structure, the vertical connection between different layers has a well impedance-matched condition and transmits the signal correctly.

16 Claims, 13 Drawing Sheets

VIA CONNECTION STRUCTURE WITH A COMPENSATIVE AREA ON THE REFERENCE PLANE

BACKGROUND

The present invention relates to a via connection structure in a RF circuit. More particularly, it relates to a via connection structure with a compensative area on a reference plane to achieve the well impedance-matching for the RF circuit.

The common electronic products comprise of one or more IC chips disposed on a substrate in the recent days. The chips could receive the signals from the substrate or from the outside devices; likewise the signals calculated by the chips transmit to the substrate or to the outside devices. Therefore, the quality of signal transmission in the substrate influences on the accuracy of the transmitting signals received by the chips or the substrate. In other words, the poor quality of the signal transmission will induce the fault or the malfunction of the electronic products.

The quality of the transmitting signal depends on the variation of the characteristic impedance in the signal transmission. Furthermore, if the characteristic impedance of the signal transmitting path is different to that of the system, i.e. the impedance mismatch, it causes a portion of the signal reflected while the signal transmits to the chips or the outside devices. The ideal condition which the characteristic impedance of the signal transmitting path matches to that of the system will cause the maximum propagation in the signals. Otherwise, most of the signal is reflected while the impedance mismatch is serious. On one hand, the chip could not receive the correct signals from the substrate; one the other hand, the substrate could not receive the correct commands from the chips. Thus, it will cause a fault, or a malfunction of the system operation.

The structure of a common substrate comprises a plurality of conductive layers and a plurality of insulation layers alternately stacked. The circuits designed for various functions are formed by the patterned-circuits on several conductive layers. The circuits on the different conductive layers are isolated by the insulation layers between of them. Thus, the via connection structure is used for the interconnection between two or more different conductive layers. The via connection structure comprises at least one via which is filled with the conductive material or is covered with the conductive material on the sidewall to electrical connect two different conductive layers. In general, the characteristic impedance is seriously deviated while the signal passing through a via connection structure. In other words, it is necessary to modify the structure to compensate the impedance deviation for the signal quality.

Please refer to FIG. 1a and FIG. 1b, wherein FIG. 1a is the schematic cross-sectional view of the four-layered substrate according to the prior art, and FIG. 1b is the schematic top view of patterned-circuits in the four-layer substrates. The substrate 100 comprises three insulation layers 112, 114, 116, a power plane 120 and a ground plane 130. The power plane 120 is disposed between the insulation layer 112 and the insulation layer 114; similarly the ground plane 130 is disposed between the insulation layer 114 and the insulation layer 116. The substrate 100 further comprises the first conductive line 142 formed on the insulation layer 112, the second conductive line 144 formed on the insulation layer 116, and a via 102 through those insulation layers 112, 114, 116, the power plane 120, and the ground plane 130. The via connection structure 140 comprises a conducting via 146 which fill in the via 102 or cover the sidewall of the via 102, the via pad 148 formed on the insulation layer 112, and the via pad 150 formed on the insulation layer 116. Two ends of the conducting via 146 electrically respectively connect to the via pad 146 and to the via pad 150. Furthermore, the conducting via 146 electrically couples to the first conductive line 142 through the ring-shaped via pad 146 and to the second conductive line 144 through the ring-shaped via pad 150.

The parasitic capacitance and the parasitic inductance of the via connection structure depend on the dielectric constant of the insulation layer, the thickness of the insulation layer, and the dimensions of the via connection structure. Please refer to FIGS. 2a and 2b respectively illustrated the character responses of the via connection structures of two different diameters in frequency domain and in Smith Chart. The curve 201 in FIG. 2a and the curve 202 in FIG. 2b are illustrated the characteristic response of the via connection structure having one via which the diameter of the via is 8 mil. Likewise, the curve 211 in FIG. 2a and the curve 212 in FIG. 2b are illustrated the characteristic response of the via connection structure having one via which the diameter of the via is 20 mil. The curve 202 in FIG. 2b is in the upper part of Smith Chart. It means that the parasitic inductance dominates the characteristic response of the 8-mil via connection structure. On the other hand, the curve 212 in FIG. 2b is in the lower part of Smith Chart. The parasitic capacitance dominates the characteristic response of the 20-mil via connection structure.

In respect to the parasitic capacitance, the parasitic capacitance between the via connection structure 140 and the power plane 120 and that between the first conductive line 142 and the power plane 120 are different. There are also different in the parasitic capacitance between the via connection structure 140 and the ground plane 130 and in that between the second conductive line 144 and the ground plane 130. Concerning about the parasitic inductance, the parasitic inductance induced by the via connection structure 140 is different from that induced by the first conductive line 142, or is different from that induced by the second conductive line 144. Thus, the difference in the parasitic capacitance and the parasitic inductance will induce the characteristic impedance deviation while the signal passes through a via connection structure, even more the malfunction of the system.

SUMMARY

In accordance with the background of the above-mentioned invention, the present invention provides a via connection structure comprises a compensated area on the reference planes to match the characteristic impedance of the via connection structure and that of the system.

In the embodiments according to the present invention, it discloses a via connection structure comprising a first conductive line on the first conductive layer, a second conductive line on the second conductive layer and a via connection structure electrically connected to the first conductive line and to the second conductive line. There is also a reference plane disposed between the first conductive layer and the second conductive layer. The compensated area is a non-conductive area formed on the reference plane and is adjacent to via connection structure. Furthermore, the compensated area overlaps the region where the first conductive line projects on the reference plane.

The construction and method of operation of the invention, however, together with additional objects and advantages thereof will be best understood from the following description of specific embodiments when read in connection with the accompanying drawings.

BRIEF DESCRIPTION OF THE DRAWINGS

Reference will now be made in detail to the present preferred embodiments of the invention, examples of which are illustrated in the accompanying drawings. Wherever possible, the same reference numbers are used in the drawings and the description to refer to the same or like parts.

DESCRIPTION

The present invention provides a via connection structure with an area on the reference plane to compensate whose characteristic impedance. The compensative area is a non-conductive area on the reference plane between two different conductive layers to compensate the parasitic capacitance between the conductive lines and the reference plane for the impedance matching.

Figure 3:
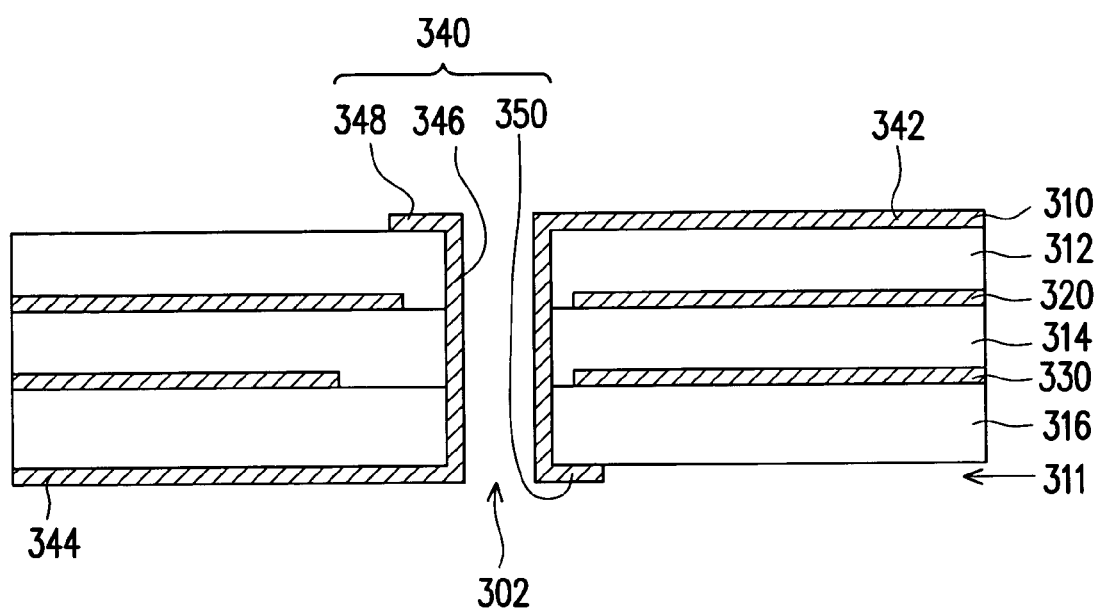
FIG. 3 schematically shows a cross-sectional view of the first embodiment according to the present invention.

Referring to FIG. 3, it schematically shows a cross-sectional view of the first embodiment according to the present invention. The first embodiment 300 is formed in a four-layer substrate comprising three insulation layers 312, 314, 316 and four conductive layers, wherein the conductive layers are subsequently the first conductive layer 310, the reference plane 320, the reference plane 330, and the second conductive layer 311. In other words, the reference plane 320 and 330 are disposed between the first conductive layer 310 and the second conductive layer 311 and isolated by those three insulation layers. In general circuit design, the reference plane 320 is one of a power plane and a ground plane, and the reference plane 330 is the other. For example, the reference plane 320 is a power plane, and the reference plane is a ground plane. However, in the design for the radio frequency (RF) application, a portion of the reference plane 320 is a ground plane for a better response behavior and for the better signal quality. The first embodiment 300 further comprises the first conductive line 342 disposed on the first conductive layer 310 and the second conductive line 344 disposed on the second conductive layer 311. Because the insulation layers 312, 314, 316 and the reference planes 320, 330 disposed between the first conductive layer 310 and the second conductive layer 311, it is necessary to form a via connection structure 340 passing through those insulation layers and conductive layers. The via connection structure 340 comprises at least one conducting via 346 and the via pads 348, 350. The conductive via 346 is a conductive material filled in the via 302 or covered on the sidewall of the via 302 to pass through the insulation layers 312, 314, 316 and the reference planes 320, 330. One end of the conducting via 346 electrically connects to the via pad 348 and the other end of the conducting via 346 electrically connects to the via pad 350. Furthermore. the via pad 348 electrically connects to the first conductive line 342, and the via pad 350 electrically connects to the second conductive lines 344. Thus, the first conductive line 342 and the second conductive line 344 are coupled through the via connection structure 340.

Figure 4:
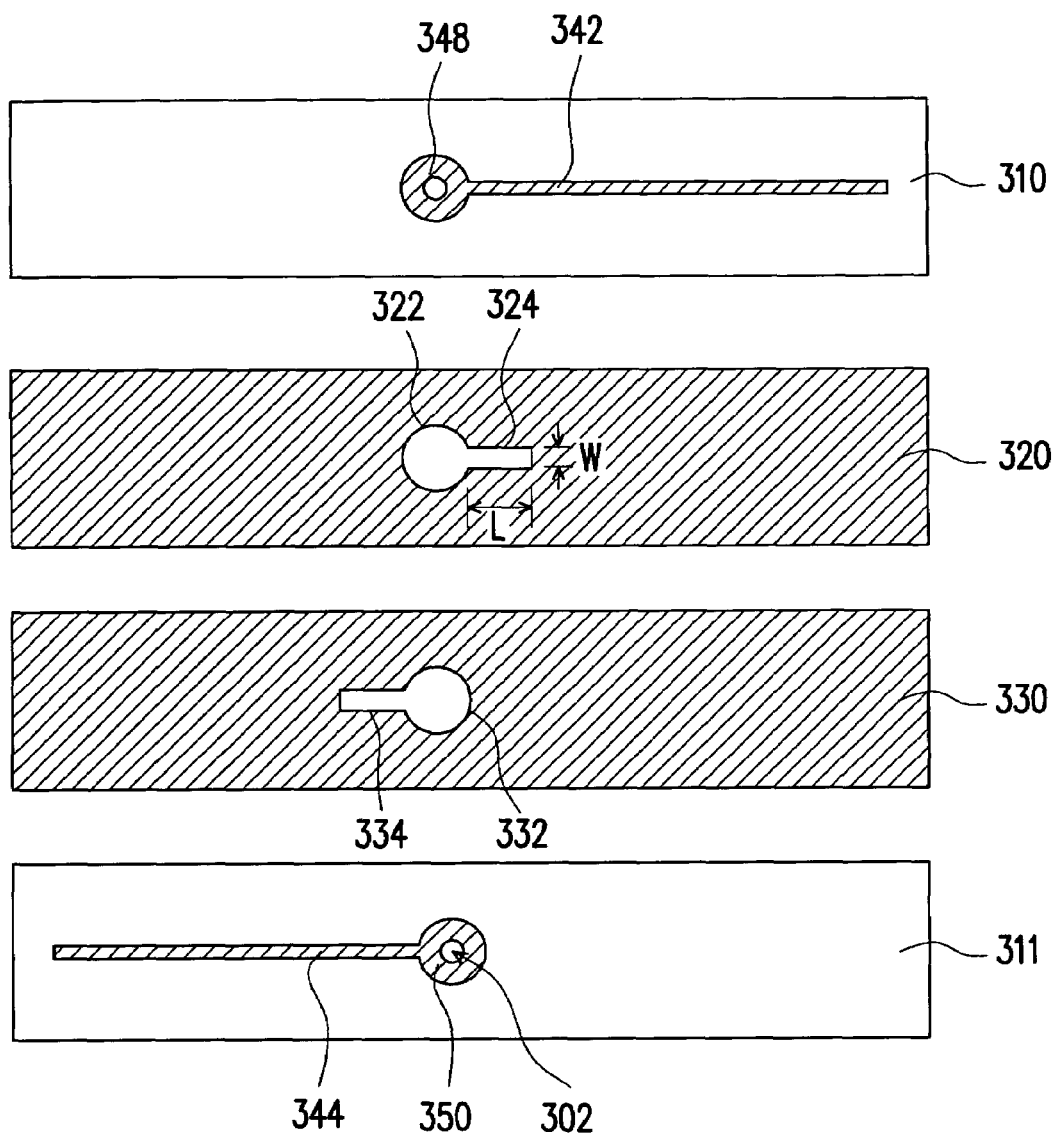
FIG. 4 schematically shows a top view of each conductive layer of the first embodiment according to the present invention.

FIG. 4 schematically illustrates the top view of each conductive layer of the first embodiment according to the present invention. Wherein the dimensions of the circuits are modified to illustrate the spirit of the present invention, i.e. the dimensions not the actual sizes. The first embodiment 300 not only comprises the elements shown in FIG. 3, but also comprises a clearance 322 where the via 302 located on the reference plane 320 and a clearance 332 where the via 302 located on the reference plane 330 for the isolation. For example, the clearance 322 and the clearance 332 are the circular non-conductive area having the diameter larger than that of the via 302. The first embodiment 300 further comprises the compensative area 324 and 334 which are the non-conductive area respectively disposed on the reference plane 320 and 330. The compensative area 324 and 334, adjacent to the via connection structure 340, are in the rectangular shape which has a length labeled as L and a width labeled as W. The compensative area 324 is joined to the clearance 322, thus the non-conductive area is in a key-hole shape. Likewise, the compensative area 334 is joined to the clearance 332 to form another key-hole shaped area on the reference plane 330. The compensative area and the clearance are formed by the same fabrication process, such as by etching the local pattern on the conductive layer for example. Furthermore, the first conductive line 342 is formed on one side of the insulation layer 312, and the reference plane 320 is on the opposite side of the insulation layer 312 shown in FIG. 3. A portion of the first conductive line 342 is above the compensative area 324 and overlaps with the region where the compensative area 324 projected on the first conductive layer 310. On the other hand, the second conductive line 344 and the reference plane 330 are respectively formed on two side of the insulation layer 346. The compensative area 334 overlaps with a portion of the region where the second conductive line 344 projected on the reference plane 330.

The compensative area 324 on the reference plane 320 reduces the parasitic capacitance between the first conductive line 342 and the reference plane 320, and the compensative area 334 similarly reduces the capacitance resulted from the second conductive line 344 and the reference plane 330. The parasitic capacitance is dependent on the shape, the dimensions and the position of the compensative areas. The less parasitic capacitance when the compensative area is closer to the via connection structure. However, it is not limited that the compensative area must be joined to the clearance as shown in the first embodiment. The compensative area could be adjacent to the clearance and is as close to the clearance as the fabricating process allowed. Besides, there would be other conductive layers existing between the conductive line and the reference plane. For example, it is at least one conductive layer existing between the first conductive line 342 and the reference plane 320 to induce a less compensation because of the larger distance between of them. Although the parasitic capacitance between the first conductive line 342 and the reference plane 320 is reduced as the distance between of them is enlarged, the compensative area 324 still provides a further less parasitic capacitance. Similarly, there would be other conductive layers existing between the reference plane 320 and the reference plane 330.

Figure 5A:
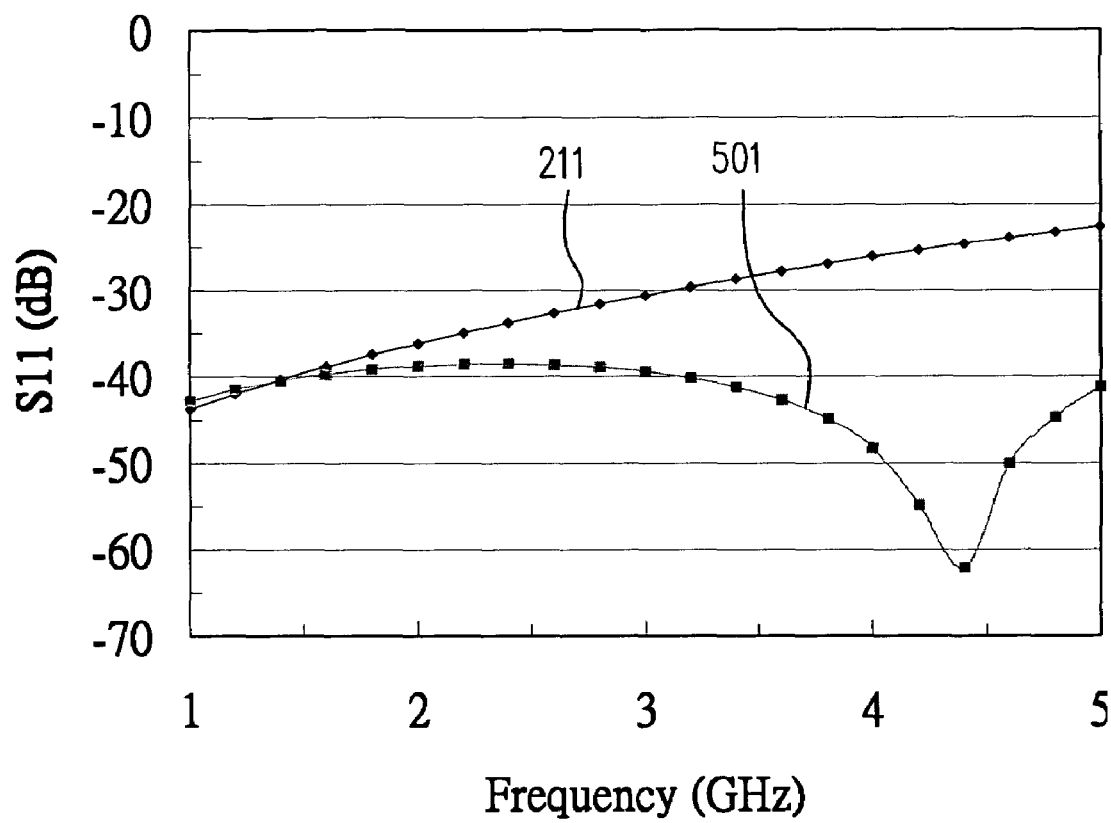
FIG. 5a shows the characteristic responses comparing the prior art and the first embodiment.
Figure 5B:
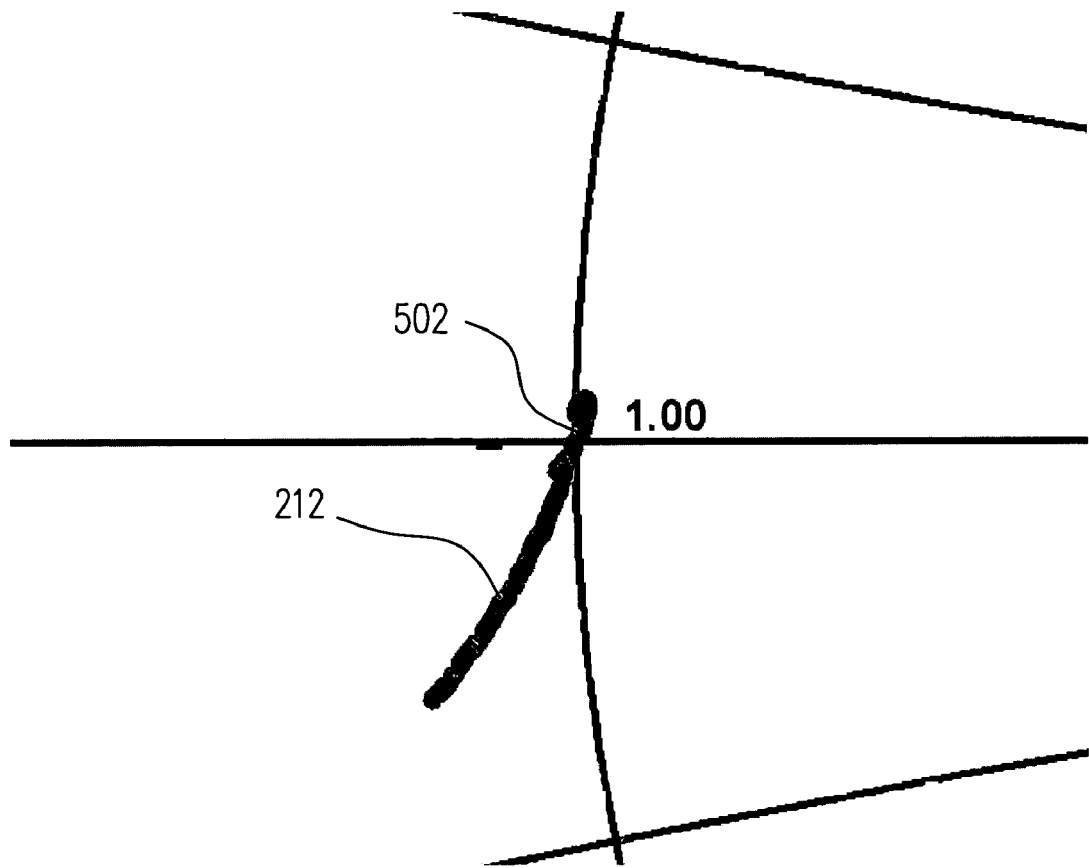
FIG. 5b shows the characteristic responses comparing the prior art and the first embodiment in Smith Chart.

In order to analyze the effects resulted from the compensative area, the response behavior of the previous via connection structure in a four-layered substrate and the response behavior of the first embodiment are shown in the frequency domain and show in Smith Chart. Referring to FIG. 5a, the curve 211 is the frequency response of the via connection structure which a diameter of the via of 20 mil, and the curve 501 shows the response of the first embodiment which is the 20-mil via connection structure with the compensative area. The curve 211 is trended up as the frequency increased, thus which means the response of the previous via connection structure is decayed due to the parasitic capacitor effect. On the other hand, the curve 501 has a better response when the operation frequency is in the range of 1~5 GHz because the parasitic capacitance is reduced by the compensative area. Referring to FIG. 5b, the curve 212 is the response of the previous via connection structure existing on the lower part of Smith Chart. It also means the response dominated by the parasitic capacitance. Because the compensative area influences the response behavior, the curve 502 which is the response behavior of the first embodiment passes through the center (1.00) of Smith Chart. It also illustrates the better response in accord with the curves shown in FIG. 5a.

Figure 1A:
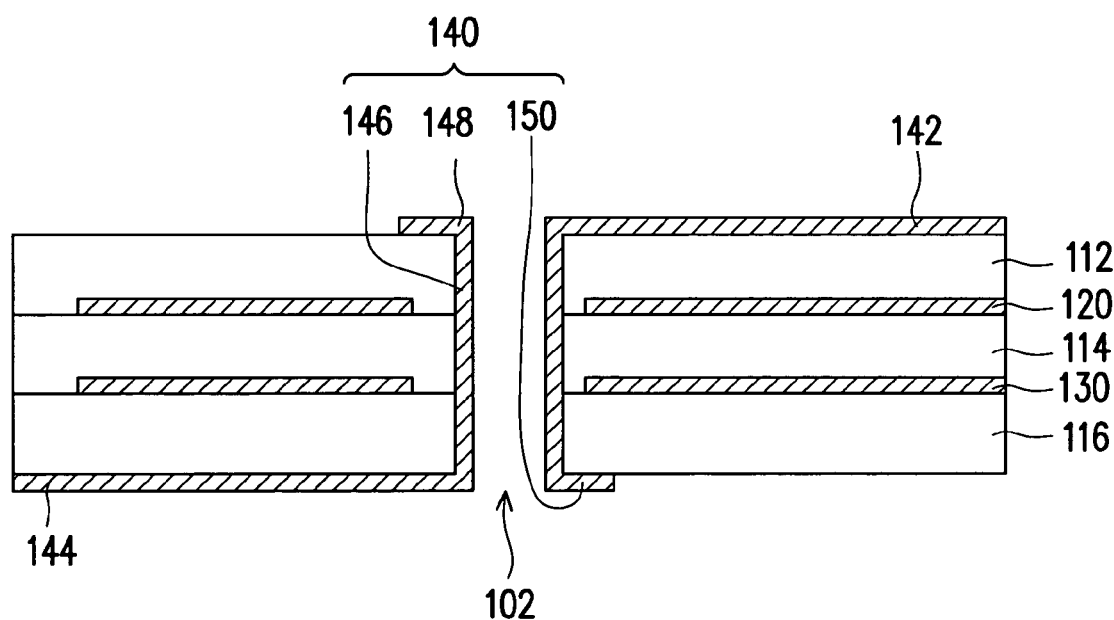
FIG. 1a schematically shows a cross-sectional view of a four-layered substrate according to the prior art.
Figure 1B:
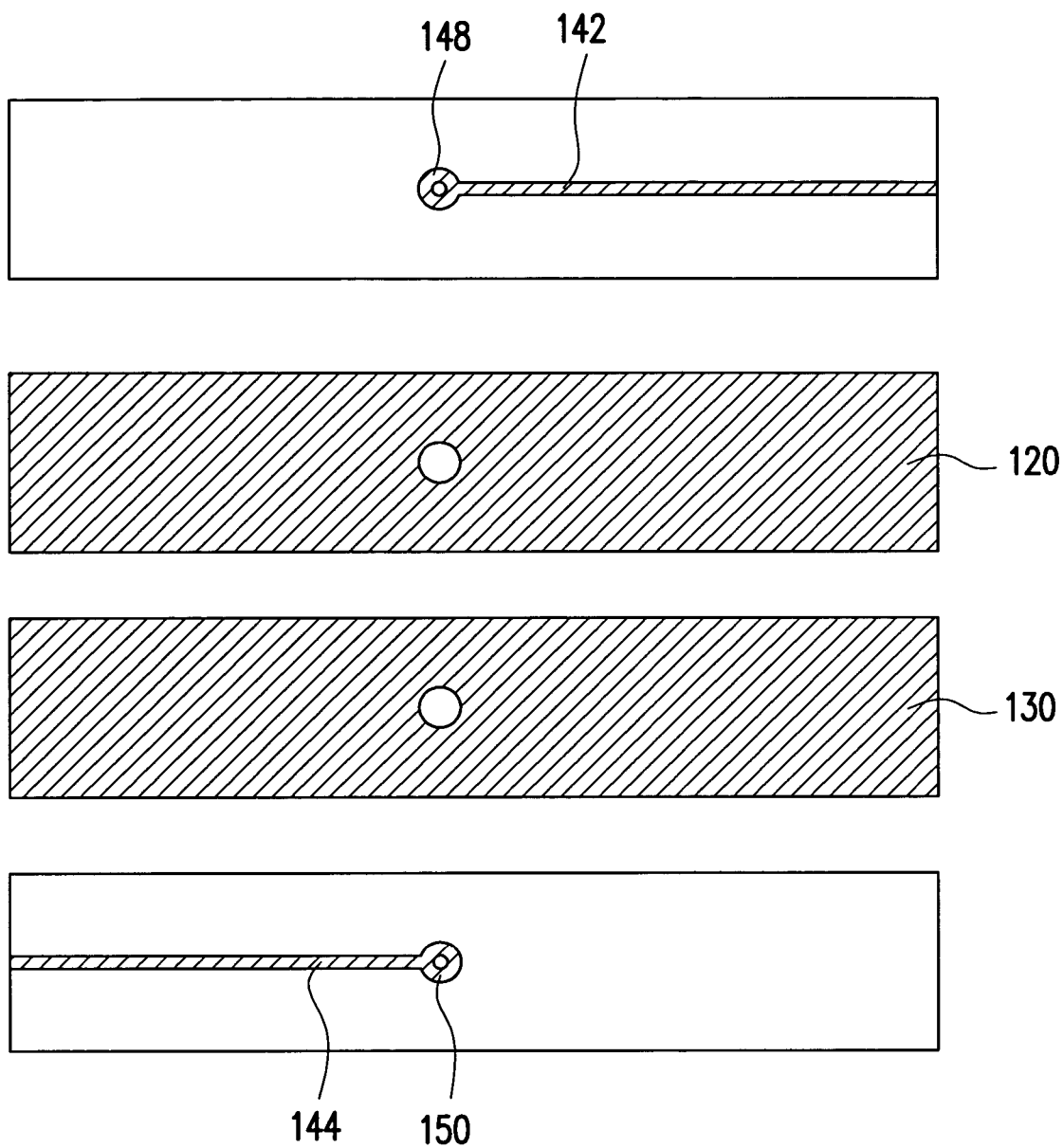
FIG. 1b schematically shows a top view of each conductive layer in the four-layered substrate according to the prior art.
Figure 2A:
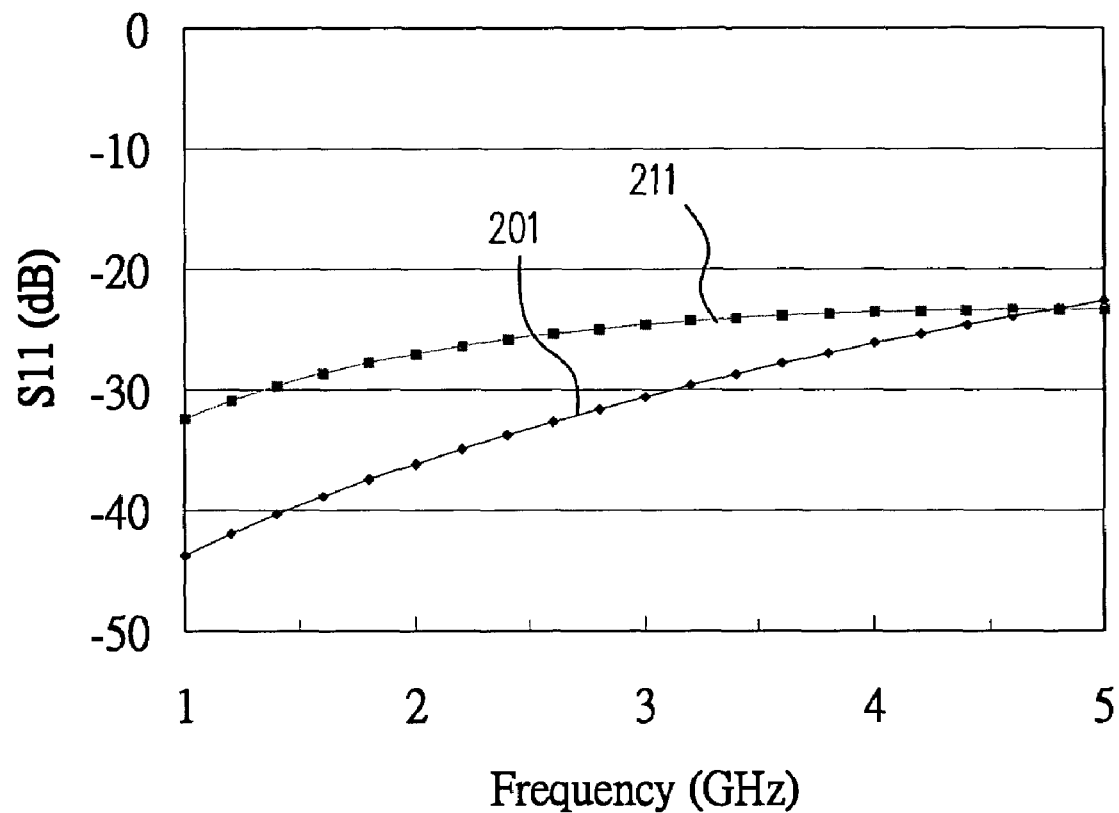
FIG. 2a shows the characteristic responses of the via connection structures with different dimensions according to the prior art.
Figure 2B:
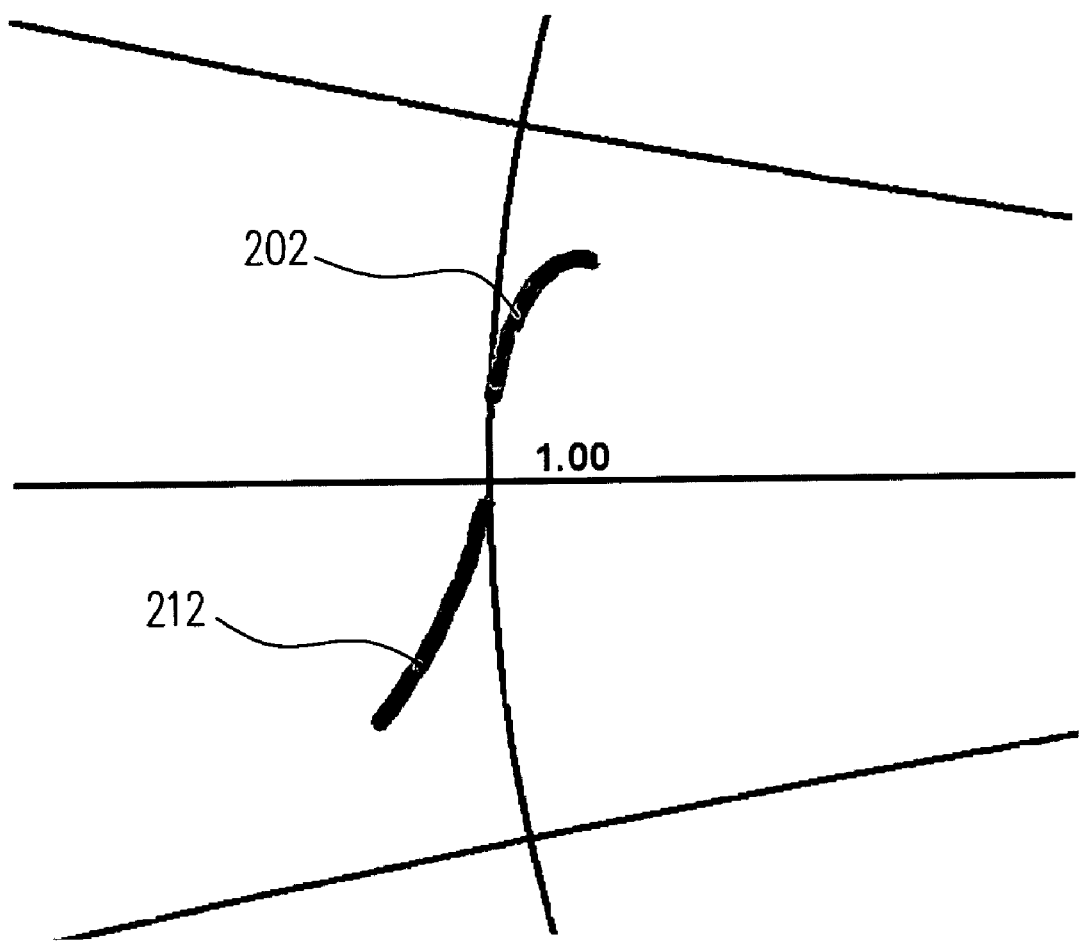
FIG. 2b is a Smith Chart showed the characteristic responses of the via connection structures with different dimensions according to the prior art.
Figure 6A:
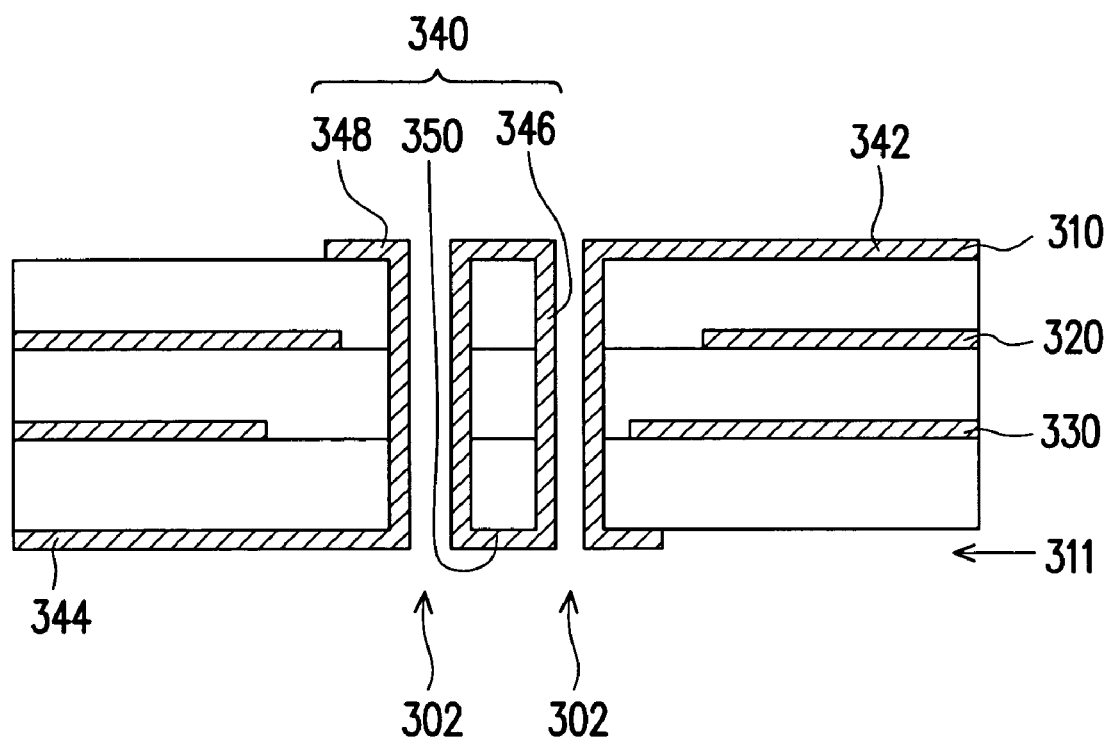
FIG. 6a schematically shows a cross-sectional view of the second embodiment according to the present invention.
Figure 6B:
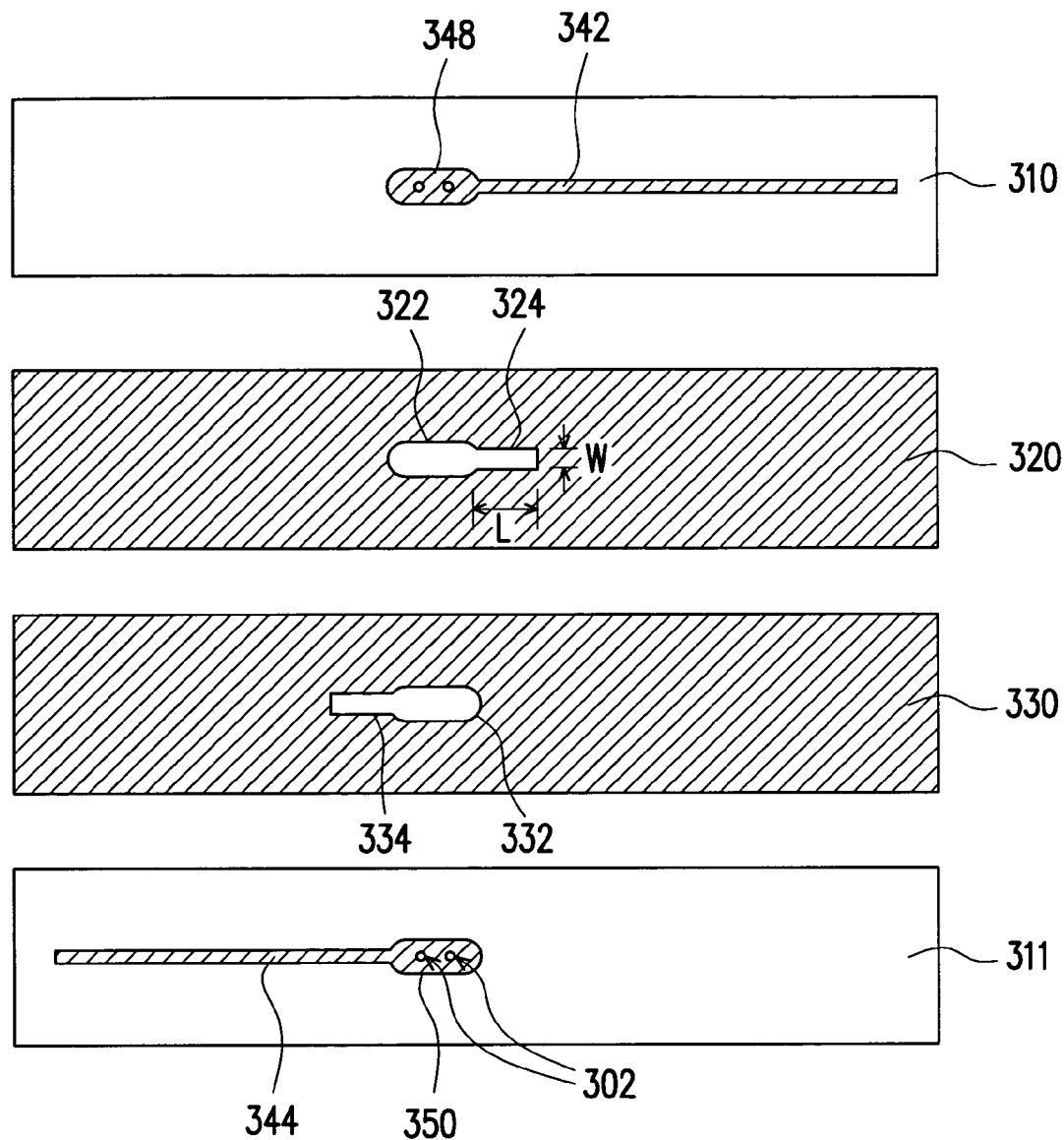
FIG. 6b schematically shows a top view of each conductive layer of the second embodiment according to the present invention.
Figure 7A:
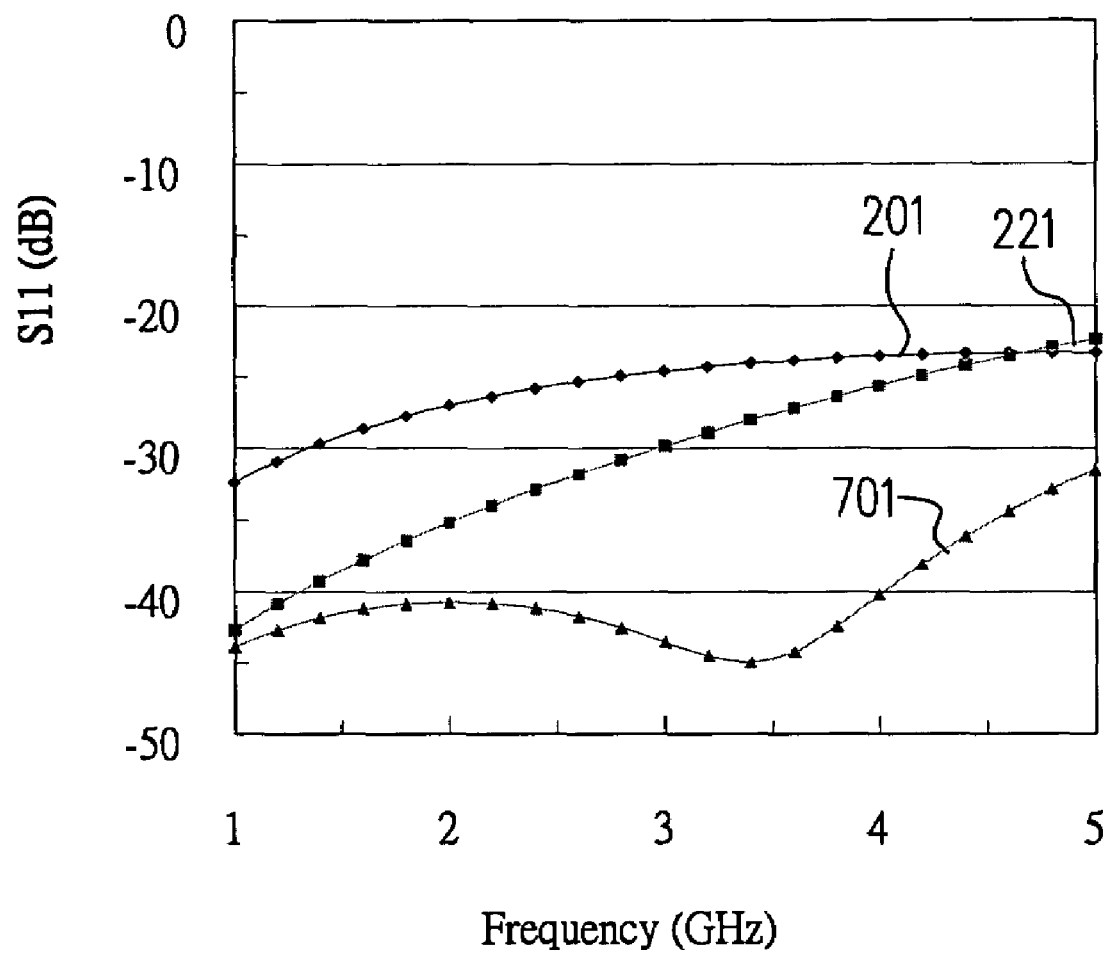
FIG. 7a shows the characteristic responses comparing the prior art and the second embodiment.
Figure 7B:
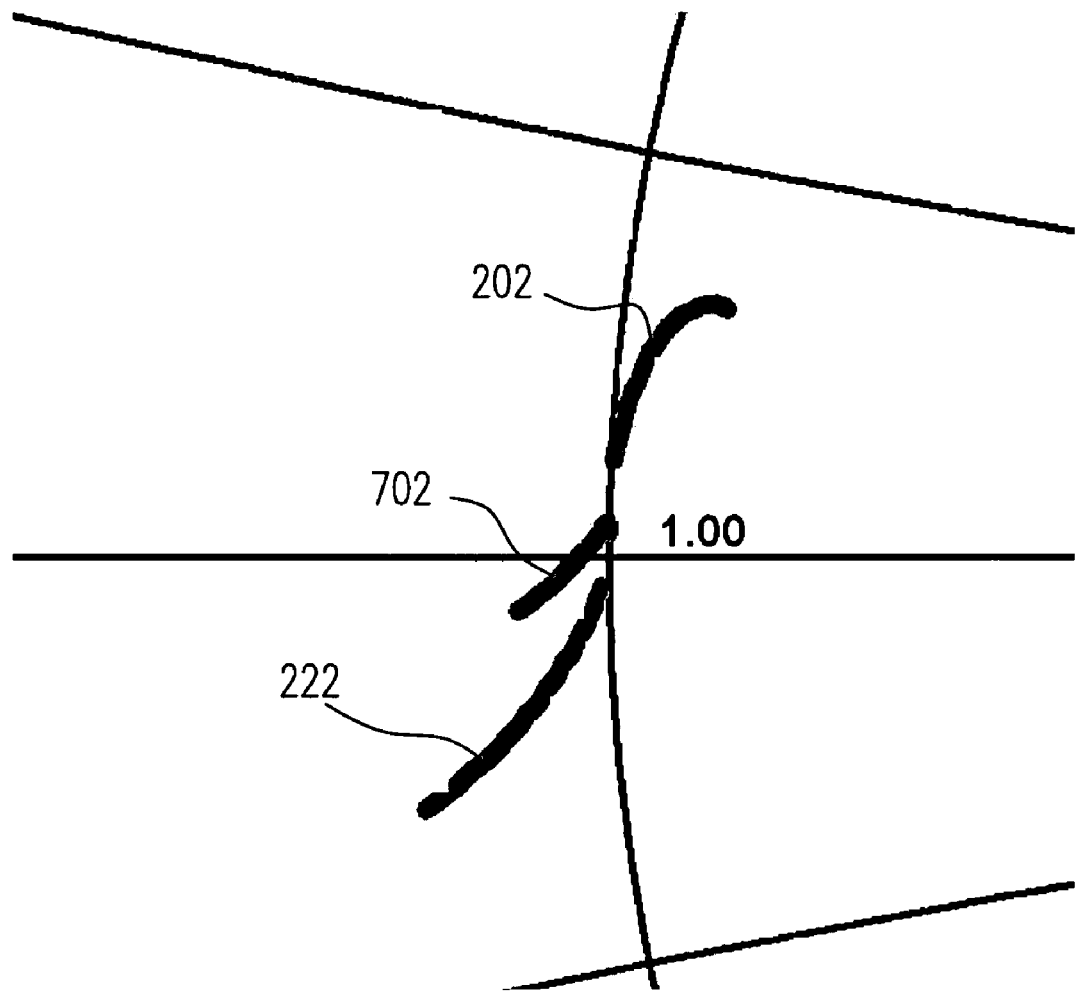
FIG. 7b shows the characteristic responses comparing the prior art and the second embodiment in Smith Chart.

Please referring to FIG. 2, the curve 202 is the response of the via connection structure which the diameter of the via is 8 mil. The curve 202 shows the response dominated by the parasitic inductance. Thus, it is well-known to reduce the parasitic inductance by connect another equivalent inductor in parallel. For example, the via connection structure having at least two parallel-connected vias passing through the insulation layers and the conductive layers. The second embodiment according to the present invention could also be applied on the 8-mil via connection structure. FIG. 6a schematically shows the cross-sectional view of the second embodiment disposed on the four-layered substrate, and FIG. 6b schematically shows a top view of each conductive layer in the second embodiment. The structure of the second embodiment is similar to that of the first embodiment, expecting the two conducting vias 302 disposed in parallel. Referring to FIG. 7a, the curve 201 is the characteristic response of previous via connection structure which has one 8-mil via, and the curve 221 is the characteristic response of the previous via connection structure which has two parallel 8-mil vias. The curve 701 is the characteristic response of the second embodiment. The curve 221 is lower the curve 201 in the low frequency region. It means that the parallel parasitic inductance provides a better response when the operation frequency is in the range of 1~3 GHz. However, the curve 221 rapidly trends up as the frequency increasing because of the over-compensated effect resulted from the two parallel-connected vias. In other words, the characteristic response of the previous via connection structure which has two parallel 8-mil vias is dominated by the parasitic capacitance. The curve 701 shows the better response of the second embodiment comparing to the curve 201 and the curve 221. FIG. 7b is a Smith Chart shown the response of the three above-mentioned via connection structures. The curve 202 is the response of the 8-mil via connection structure which is also presented in FIG. 2b. The curve 222 which is represented the response of the via connection structure having two 8-mil vias is on the lower part of Smith Chart. Thus the characteristic response of the via connection structure which has two 8-mil vias is dominated by the parasitic capacitance in accord with the curve 222 shown in FIG. 7a. The curve 702, which is represented the response of the second embodiment, is closer to the center point of Smith Chart. Thus, the second embodiment is an optimized design for the multiple vias connection structure. According to the above-mentioned descriptions and embodiments, the present invention would provide a suitable compensative area for impedance matching no matter what the characteristic response of the previous via connection structure is.

Figure 8:
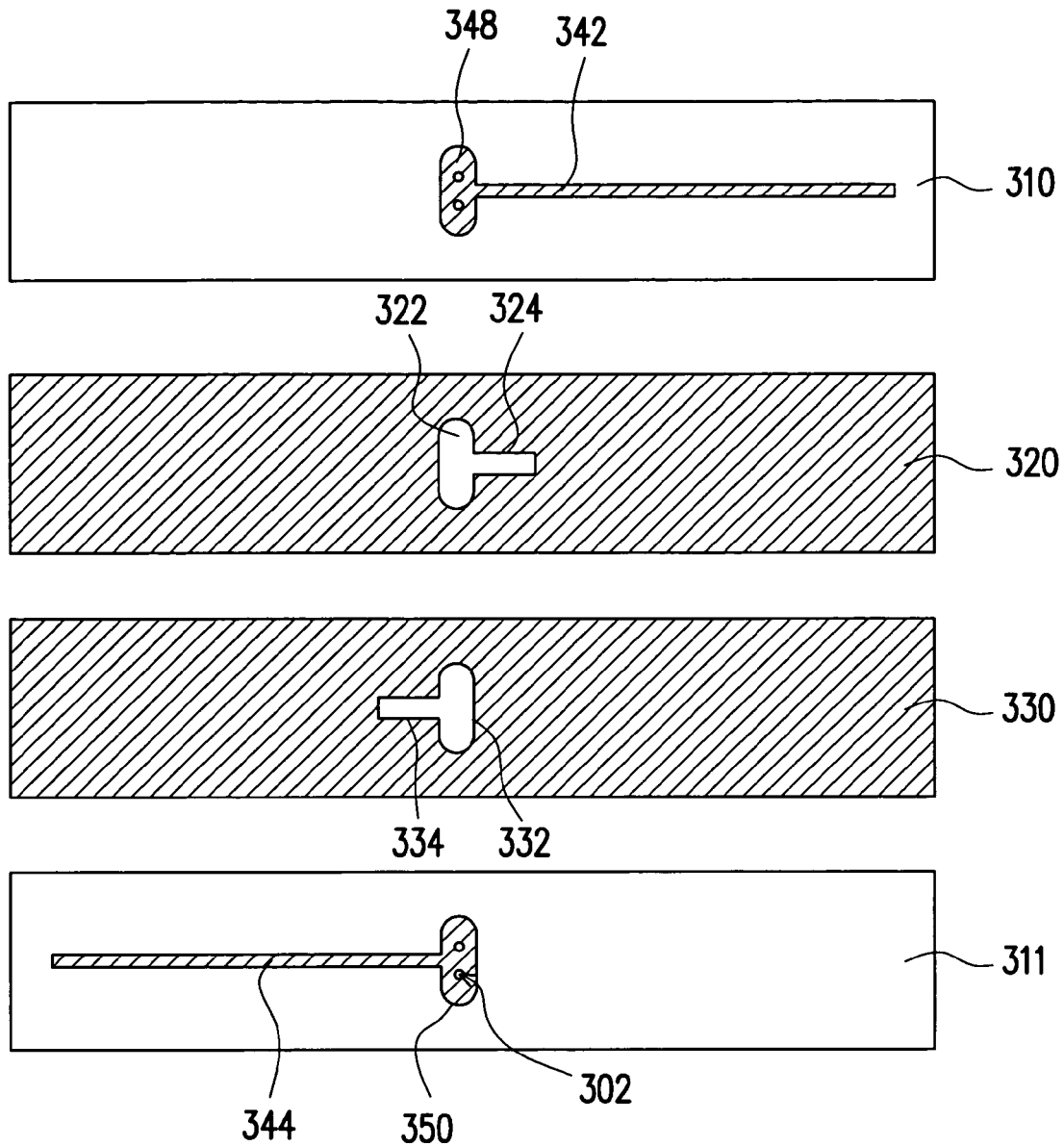
FIG. 8 schematically shows a top view of each conductive layer of the third embodiment according to the present invention.

However, above preferable embodiments are just applied to describe the invention in detail and are not set a limitation to the range of the invention. Those who are familiar with such kind of arts should understand that appropriate and slight variation and modification still possess the merits of the invention and are also within the spirit and the range of the invention. For example, the third embodiment shown in FIG. 8 is applied to the via connection structure which also has two 8-mil vias. The third embodiment has two conducting vias 302 disposed along a virtual line perpendicular to the first conductive line in the top view shown in FIG. 8. It also provides an equivalent circuit with two equivalent inductors connected in parallel to reduce the parasitic inductance. Besides, the reference planes are ground planes in the embodiments. The present invention also provides the same effect to reduce the parasitic capacitance between the conductive lines and the reference planes and to achieve impedance matching even when some of the reference planes are power planes or when all the reference planes are power planes. In addition, the compensative area is conjoint to the clearance for better performance and easy fabrication. However, it is possible to keep a slim between the compensative area and the clearance in the allowance of the fabrication process. The compensative area is not limited in rectangular shape. The compensative area in a various contour on the reference plane to reduce the parasitic capacitance between the circuit and the reference plane for the impedance matching is still in the spirit of the present invention. In sum, the characteristic response of the previous via connection structure is dependent on the dimensions of the via connection structure, the dielectric constant of the insulation layer, and the thickness of the insulation layer. No matter what kind response of the via connection structure is, the compensative area on the reference plane for impedance matching is disclosed in the above-mentioned embodiments and illustrations. The present invention provides the compensative area on the reference plane to reduce the parasitic capacitance of the via connection structure. According to the characteristic response of previous structure, the impedance matching is achieved by the disposition of the well-designed compensative area and the modification of the conducting vias.

Although the invention is illustrated and described herein as embodied in one or more specific examples, it is nevertheless not intended to be limited to the details shown, since various modifications and structural changes may be mode therein without departing from the spirit of the invention and within the scope and claims be constructed broadly and in a manner consistent with the scope of the invention, as set forth in the following claims.

What is claimed is:

1. A via connection structure suitable for a multi-layer substrate which comprises a plurality of conductive layers and a plurality of insulation layers alternately stacked, comprising:
    a first conductive line disposed on a first conductive layer;
    a second conductive line disposed on a second conductive layer;
    at least a reference plane disposed between the first conductive layer and the second conductive layer, and having at least a clearance which is a first non-conductive area;
    a via connection structure electrically connected to the first conductive line and the second conductive line having at least one conducting via passing through the conductive layers, insulation layers and the clearance of the reference plane; and
    at least a compensative area, which is a second non-conductive area on the reference plane, wherein the compensative area is adjacent to the clearance and is overlapped with a portion of the region where the conductive line projects on the adjacent reference plane.

2. The via connection structure with the compensative area of claim 1, wherein the via connection structure comprises one conducting via.

3. The via connection structure with the compensative area of claim 1, wherein the via connection structure comprises two conducting vias.

4. The via connection structure with the compensative area of claim 1, wherein the reference plane is a ground plane or a power plane.

5. The via connection structure with the compensative area of claim 1, wherein the reference plane is adjacent to the first conductive layer, and the compensative area is overlapped with a portion of the region where the first conductive line projects on the reference plane.

6. The via connection structure with the compensative area of claim 1, wherein the compensative area is in a rectangular shape.

7. The via connection structure with the compensative area of claim 1, wherein the compensative area and the clearance are joined as a keyhole-shaped non-conductive area.

8. The via connection structure with the compensative area of claim 1, wherein the compensative area is formed by an etching process.

9. The via connection structure with the compensative area of claim 1, wherein
    the via connection structure comprises a plurality of the reference planes which comprise a first reference plane and a second reference plane, a plurality of the clearances which comprise a first clearance and a second clearance, and a plurality of the compensative areas which comprise a first compensative area and a second compensative area,
    the first reference plane, which is adjacent to the first conductive layer and is between the first conductive layer and the second conductive layer, has the first clearance which is the first non-conductive area,
    the second reference plane, which is adjacent to the second conductive layer and is between the first conductive layer and the second conductive layer, has a second clearance which is a third non-conductive area,
    the via connection structure electrically connected to the first conductive line and the second conductive line has at least one conducting via passing through the conductive layers, insulation layers, the first clearance and the second clearance,
    the first compensative area is the second non-conductive area on the first reference plane,
    the second compensative area is a fourth non-conductive area on the second reference plane,
    the first compensative area is overlapped with a portion of the region where the first conductive line projects on the first reference plane, and
    the second compensative area is overlapped with a portion of the region where the second conductive line projects on the second reference plane.

10. The via connection structure with the compensative area of claim 9, wherein the via connection structure comprises one conducting via.

11. The via connection structure with the compensative area of claim 9, wherein the via connection structure comprises two conducting vias.

12. The via connection structure with the compensative area of claim 9, wherein the first reference plane is a ground plane or a power plane, and the second reference plane is a ground plane or a power plane.

13. The via connection structure with the compensative area of claim 9, wherein the compensative area is in a rectangular shape.

14. The via connection structure with the compensative area of claim 1, wherein the reference plane is adjacent to the second conductive layer, and the compensative area is overlapped with a portion of the region where the second conductive line projects on the reference plane.

15. The via connection structure with the compensative area of claim 9, wherein the first compensative area and the first clearance are joined as a keyhole-shaped non-conductive area.

16. The via connection structure with the compensative area of claim 9, wherein the second compensative area and the second clearance are joined as a keyhole-shaped non-conductive area.

* * * * *